(12) United States Patent
Lin et al.

(10) Patent No.: US 7,102,455 B2
(45) Date of Patent: Sep. 5, 2006

(54) ARRANGEMENTS OF DIFFERENTIAL PAIRS IN MULTI-LAYER PRINTED CIRCUIT BOARD FOR ELIMINATING CROSSTALK

(75) Inventors: Yu Hsu Lin, San Jose, CA (US); Shang Tsang Yeh, Tu-chen (TW)

(73) Assignees: Hon Fu Jin Precision Ind. (Shenzhen) Co., Ltd., Shenzhen (CN); Hon Hai Percision Ind. Co., Ltd., Taipei Hsien (TW)

( * ) Notice: Subject to any disclaimer, the term of this patent is extended or adjusted under 35 U.S.C. 154(b) by 10 days.

(21) Appl. No.: 10/783,596

(22) Filed: Feb. 19, 2004

(65) Prior Publication Data
US 2005/0099240 A1 May 12, 2005

(30) Foreign Application Priority Data
Nov. 11, 2003 (TW) .............................. 92131469 A

(51) Int. Cl.
*H01P 3/02* (2006.01)
(52) U.S. Cl. .............................................. 333/1; 333/5
(58) Field of Classification Search .................... 333/1, 333/4, 5
See application file for complete search history.

(56) References Cited

U.S. PATENT DOCUMENTS
5,966,056 A * 10/1999 Thornton ........................ 333/5

OTHER PUBLICATIONS
Applicant: NEC; Inventor: Kazuhiko, Sekihara; Pub No.: 20011015925; Pub Date: Jan. 19, 2001; Patent Abstracts of Japan.*

* cited by examiner

Primary Examiner—Benny T. Lee
(74) Attorney, Agent, or Firm—Wei Te Chung

(57) ABSTRACT

An arrangement of differential pairs in a multi-layer printed circuit board is provided for eliminating crosstalk. The arrangement of differential pairs in the multi-layer printed circuit board includes a first differential pair, and a second differential pair. The first differential pair and the second differential pair may each be a driven pair or a victim pair. By properly arranging the first differential pair and the second differential pair, in accordance with the present invention, the resultant crosstalk on the first differential pair induced by the second differential pair, or vice versa, is substantially zero or negligible.

6 Claims, 3 Drawing Sheets

ARRANGEMENTS OF DIFFERENTIAL PAIRS IN MULTI-LAYER PRINTED CIRCUIT BOARD FOR ELIMINATING CROSSTALK

BACKGROUND OF THE INVENTION

1. Field of the Invention

The present invention relates generally to printed circuit boards, and more particularly, to arrangements of different pairs in printed circuit boards.

2. Prior Art

Crosstalk is an omnipresent phenomenon in a high frequency circuits. The existence of crosstalk in high frequency circuits induces unexpected erroneous signals from a driven signal trace to a victim signal trace, the crosstalk screws up the original signals intended to be sent on the victim signal trace. For this reason, efforts have been devoted to develop means for eliminating such unwanted crosstalk phenomena.

One reason for employing differential pairs in high frequency circuits is that crosstalk in differential pairs may largely be reduced. The electronics industry has evolved to demand a higher and higher integration of signal traces in one single printed circuit board, however, since crosstalk is sensitive to the spacing between signal traces, i.e. the larger the spacing, the smaller the crosstalk, crosstalk between two differential pairs is no longer negligible. Referring to FIG. 1, wherein an arrangement of two differential pairs in a printed circuit board 100 is illustrated. As shown, the printed circuit board 100 comprises a dielectric layer 110, a first differential pair 120 comprising a first signal trace 121 and a second signal trace 122, and a second differential pair 130 comprising a third signal trace 131 and a fourth signal trace 132. In this particular example of prior art, the spacing between the first signal trace 121 and the second signal trace 122 is equal to the spacing between the third signal trace 131 and the fourth signal trace 132. Both the first differential pair 120 and the second differential pair 130 are disposed on the dielectric layer 110. Conventionally, the dielectric layer 110 is disposed on a ground plane (not shown). Since the presence of a ground plane does not affect crosstalk between the first differential pair 120 and the second differential pair 130, the illustration of which is thus neglected.

As shown in FIG. 1, suppose that the first differential pair 120 is a driven pair and the second differential pair 130 is a victim pair, the crosstalk on the second differential pair 130 due to the first differential pair 120 is equal to the sum of the crosstalk induced on the third signal trace 131 and on the fourth signal trace 132. The crosstalk induced on the third signal trace 131 and on the fourth signal trace 132 are equal to the sum of crosstalk due to the first signal trace 121 and the second signal trace 122. One may denote the crosstalk on the third signal trace 131 due to the first signal trace 121 by X31, the crosstalk on the third signal trace 131 due to the second trace 122 by X32, the crosstalk on the fourth signal trace 132 due to the first signal trace 131 by X41, and the crosstalk on the fourth signal trace 132 due to the second signal trace 132 by X42. Since crosstalk is primarily induced at the rise time or the fall time of a signal, if a positive crosstalk is induced at the rise time, a negative crosstalk is then induced at the fall time. Therefore, the total crosstalk induced on the second differential pair 130 due to the first differential pair 120 is equal to (X31–X32)–(X41–X42). Since the spacing between the third signal trace 131 and the first signal trace 121 is equal to the spacing between the fourth signal trace 132 and the second signal trace 122, X31 equals X42. Consequently, the total crosstalk induced on the second differential pair 130 due to the first differential pair 120 is equal to (2*X31–X32–X41). In order to make this resultant total crosstalk negligible, one way is to increase the spacing between the first differential pair 120 and the second differential pair 130, leaving X31 approaching X32 and X41 approaching X31 (or X42). By doing so, large real estate of a printed circuit board is required, which greatly limits the integration of signal traces on a printed circuit board. Alternatively, the other way is to set the second differential pair at another layer of the printed circuit board and electrically isolated from the first differential pair.

SUMMARY OF THE INVENTION

An objective of the present invention is to provide an arrangement of differential pairs in a multi-layer printed circuit board for eliminating crosstalk without enlarging the real estate of the printed circuit board.

The arrangement of differential pairs in the multi-layer printed circuit board comprises a dielectric material, a first differential pair and a second differential pair. The first differential pair further comprises a first signal trace and a second signal trace, while the second differential pair further comprises a third signal trace and a fourth signal trace. In one particular embodiment of the present invention, the first signal trace and the fourth signal trace are disposed in the dielectric material in one layer of the multi-layer printed circuit board, while the second signal trace and the third signal trace are disposed in the dielectric material in another layer of the multi-layer printed circuit board, the third signal trace being substantially below the first signal and the second signal trace being substantially below the fourth signal trace. The crosstalk in this particular embodiment is mutually canceled, giving rise to an arrangement with zero crosstalk.

In another particular embodiment of the present invention, the arrangement of differential pairs in the multi-layer printed circuit board further comprises a ground plane, the first differential pair being disposed in one layer of the multi-layer printed circuit board, the second differential pair being disposed in another layer of the multi-layer printed circuit board, and the ground plane being disposed in a layer between that of the first differential pair and that of the second differential pair. Most of the crosstalk in this arrangement is shielded out or absorbed by the ground plane, which gives rise to an arrangement with negligible crosstalk.

BRIEF DESCRIPTION OF THE DRAWINGS

The present invention is better understood by referring to the detailed description of the preferred embodiment taken in conjunction with the drawings, in which like reference numerals denote like elements, and wherein.

DETAILED DESCRIPTION OF THE INVENTION

Prior to setting forth the detailed description of the preferred embodiments of the present invention, one should bear in mind that the present invention as discussed below is applicable in printed circuit boards of both the microstrip type and the stripline type. Since one or more ground planes may be required to form a printed circuit board of the microstrip type or the stripline type, however, the presence of such ground planes may not significantly enhance or reduce crosstalk between differential pairs disposed in or on a printed circuit board, the illustration and discussion of which is thus hereinafter neglected. Therefore, it is appreciated that only those ground planes that may significantly affect crosstalk between differential pairs are illustrated and discussed. In addition, dielectric materials used in the printed circuit board as will be discussed in the following are presumed homogeneous, i.e. the dielectric constants of those dielectric materials are the same throughout the entire printed circuit board of discussion, and are preferably made of FR4 material. However, possible applications of the present invention are not limited only thereto.

In the following, the first through the fifth embodiments of the present invention disclose arrangements of differential pairs that may eliminate crosstalk by mutual cancellations, and that do not employ a ground plane, while the sixth through the eight embodiments of the present invention disclose arrangements of differential pairs that may eliminate crosstalk by employing at least one ground plane for shielding out the crosstalk effect.

Figure 1:
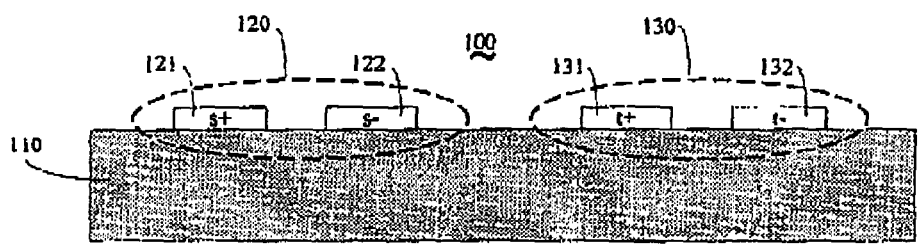
FIG. 1 illustrates a conventional arrangement of two differential pairs in a printed circuit board.
Figure 2:
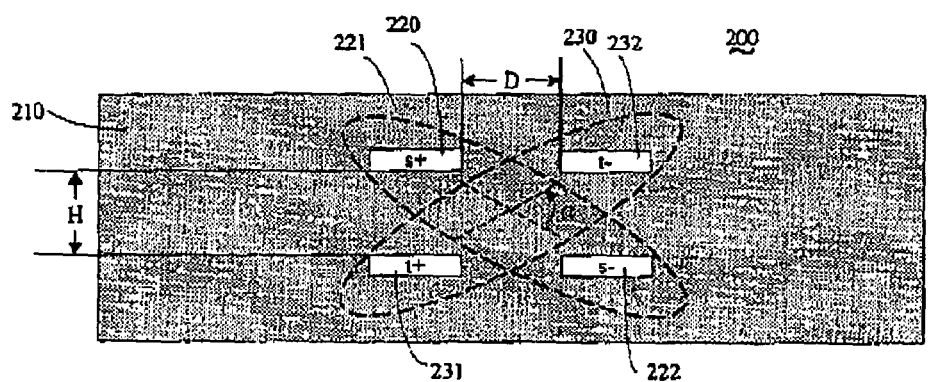
FIG. 2 illustrates an arrangement of two differential pairs in a multi-layer printed circuit board, in accordance with the first particular embodiment of the present invention.

Attention is now directed to FIG. 2, wherein an arrangement of differential pairs in a multi-layer printed circuit board 200, in accordance with the first particular embodiment of the present invention, is illustrated. The multi-layer printed circuit board 200 comprises a dielectric material 210 with a dielectric constant $\in 1$, a first differential pair 220 and a second differential pair 230. The first differential pair 220 further comprises a first signal trace 221 and a second signal trace 222, while the second differential pair 230 further comprises a third signal trace 231 and a fourth signal trace 232. Both the first differential pair 220 and the second differential pair 230 are disposed in the dielectric material 210. As shown in FIG. 2, the first signal trace 221 and the fourth signal trace 232, which are separated by a distance D, are disposed in one layer of the multi-layer printed circuit board 200, while the second signal trace 222 and the third signal trace 231, which are also separated by a distance D, are disposed in another layer of the multi-layer printed circuit board 200. The third signal trace 231 is located substantially below the first signal trace 221 with a distance H, while the second signal trace 222 is also located substantially below the fourth signal trace 232 with a distance H. Let the first differential pair 220 be a driven pair and that the second differential pair be a victim pair, the crosstalk on the fourth signal trace 232 is the sum of that induced by the first signal trace 221 and by the second signal trace 222. It is appreciated that whether a differential pair being a driven pair or a victim pair is a matter of choice, the resultant crosstalk is the same if a different choice is made. One may denote the crosstalk on the fourth signal trace 232 due to the first signal trace 221 by X41 and the crosstalk on the fourth signal trace 232 due to the second trace 222 by X42. Since crosstalk is primarily induced at the rise time or the fall time of a signal, if a positive crosstalk is induced at the rise time, a negative crosstalk is then induced at the fall time. For a differential pair, a rising edge in one signal trace corresponds to a falling edge in the other signal trace. Thus, the resultant crosstalk on the fourth signal trace 232 is equal to X41−X42. Similarly, denote the crosstalk on the third signal trace 231 due to the first signal trace 221 by X31 and the crosstalk on the third signal trace 231 due to the second trace 222 by X32. The resultant crosstalk on the third signal trace 231 is equal to X31−X32. Since crosstalk is sensitive to the spacing between signal traces, any person having ordinary skill in the art may find an optimized D and H such that X41 equals X42 and X31 equals X32. In this particular embodiment, D is 5.2 mils and H is 8.6 mils. Therefore, it is concluded that there is no crosstalk on the second different pair 230 induced by the first differential pair 220.

It is noted that in the applicant earlier granted U.S. Pat. No. 6,486,405 the two differential pairs are essentially perpendicular to each other. Differently, in FIG. 2 of the instant invention, the intersection angle α between the two lines each of which links the two center points of the two traces of each differential pair, is different from 90 degrees. Understandably, if the signal trace is configured like a square or a circle, the intersection angle α is expected to be close to 90 degrees and the dimension of D and H should be equal to each other. Anyhow, because the signal trace owns the rectangular shape, and the (linking) line links the two center points of the two traces of the corresponding differential pair is not either parallel to or perpendicular to the longitudinal direction of the corresponding traces, this oblique angular relation between the linking line and the corresponding traces will bring about a non-90 degrees of the intersection angle between the two linking lines of the two corresponding differential pairs, thus further resulting in the unequal D and H.

Figure 3:
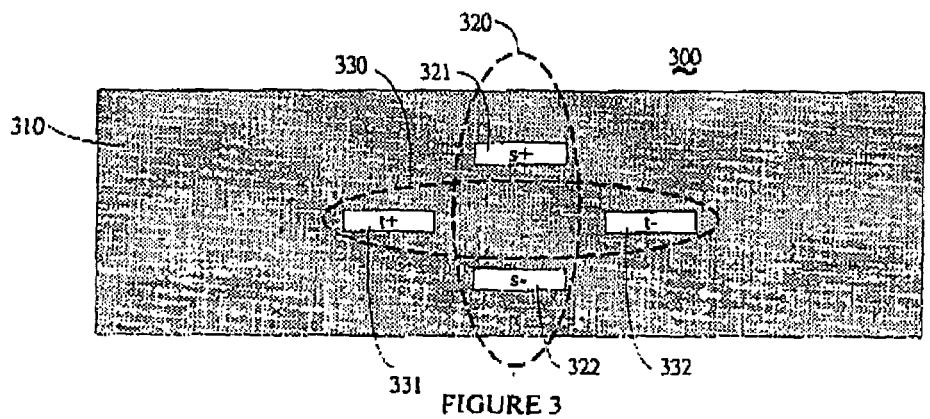
FIG. 3 illustrates an arrangement of two differential pairs in a multi-layer printed circuit board, in accordance with the second particular embodiment of the present invention.

Referring now to FIG. 3, wherein an arrangement of differential pairs in a multi-layer printed circuit board 300, in accordance with the second particular embodiment of the present invention, is illustrated. The multi-layer printed circuit board 300 comprises a dielectric material 310 with a dielectric constant $\in 2$, a first differential pair 320 and a second differential pair 330. The first differential pair 320 farther comprises a first signal trace 321 and a second signal trace 322, while the second differential pair 330 further comprises a third signal trace 331 and a fourth signal trace 332. Both the first differential pair 320 and the second differential pair 330 are disposed in the dielectric material 310. As shown in FIG. 3, the second differential pair 330 is disposed in one layer of the multi-layer printed circuit board 300, while the first signal trace 321 of the first differential pair 320 is disposed in another layer of the multi-layer printed circuit board 300 above that where the second differential pair 330 is disposed and the second signal trace 322 of the first differential pair 320 is disposed in another layer of the multi-layer printed circuit board 300 below that where the second differential pair 330 is disposed. The signal traces altogether form a diamond shape. Similar to the above discussions for the first embodiment of the present invention, since the separation between the first signal trace 321 and the third signal trace 331 is equal to the separation between the first signal trace 321 and the fourth signal trace 332, the crosstalk on the first signal trace 321 induced by the third signal trace 331 cancels with that induced by the fourth signal trace 332. Also, since the separation between the second signal trace 322 and the third signal trace 331 is equal to the separation between the second signal trace 322 and the fourth signal trace 332, the crosstalk on the second signal trace 322 induced by the third signal trace 331 cancels with that induced by the fourth signal trace 332. As a result, there is no crosstalk on the second different pair 330 induced by the first differential pair 320.

Figure 4:
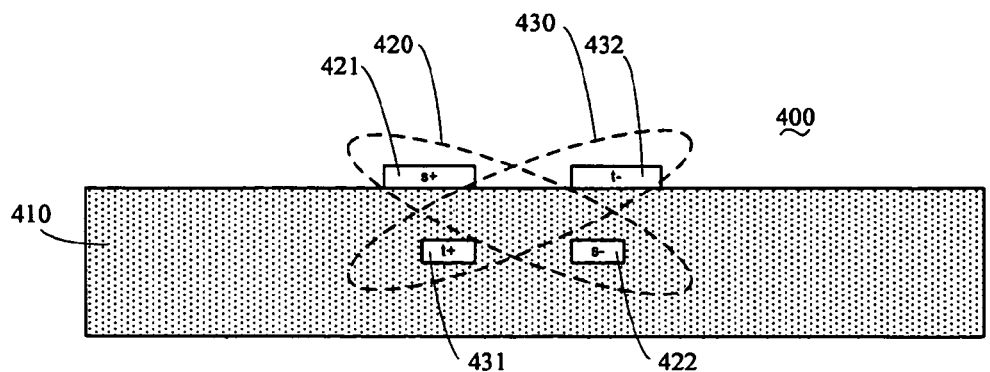
FIG. 4 illustrates an arrangement of two differential pairs in a multi-layer printed circuit board, in accordance with the third particular embodiment of the present invention.

Referring now to FIG. 4, wherein an arrangement of two differential pairs in a multi-layer printed circuit board 400, in accordance with the third particular embodiment of the present invention, is illustrated. As shown, the printed circuit board 400 comprises a dielectric material 410 with a dielectric constant $\in 3$, a first differential pair 420 and a second differential pair 430. The first differential pair 420 further comprises a first signal trace 421 and a second signal trace 422, while the second differential pair 430 further comprises a third signal trace 431 and a fourth signal trace 432. The first signal trace 421 and the fourth signal trace 432 are disposed on the dielectric material 410, while the second signal trace 422 and the third signal trace 431 are disposed in the dielectric material 410. As shown in FIG. 4, the second signal trace 422 and the third signal trace 431 are disposed in one layer of the multi-layer printed circuit board 400 substantially below the first signal trace 421 and the fourth signal trace 432, respectively. Similar to the above discussions for the first embodiment of the present invention, the crosstalk on the first signal trace 421 induced by the third signal trace 431 may be denoted X13, while the crosstalk on the first signal trace 421 induced by the fourth signal trace 431 may be denoted as X14. The resultant crosstalk on the first signal trace 421 induced by the second differential pair is X13–X14. Similarly, the resultant crosstalk on the second signal trace 422 induced by the second differential pair is X23–X24. The total crosstalk on the first differential pair due to the second differential pair is thus (X13–X14)–(X23–X24). Since crosstalk is sensitive to the spacing between signal traces, any person having ordinary skill in the art may find an optimized arrangement such that X13 equals X14 and X23 equals X24, or X13 equals X23 and X14 equals X24. As a result, there is no crosstalk on the first different pair 420 induced by the second differential pair 430. It is noted that the width of the trace 421 is larger than that of the trace 422 for adjusting dielectric constant because the trace 421 is exposed to an exterior on the printed circuit board but the trace 422 is veiled/embedded in the printed circuit board.

Figure 5:
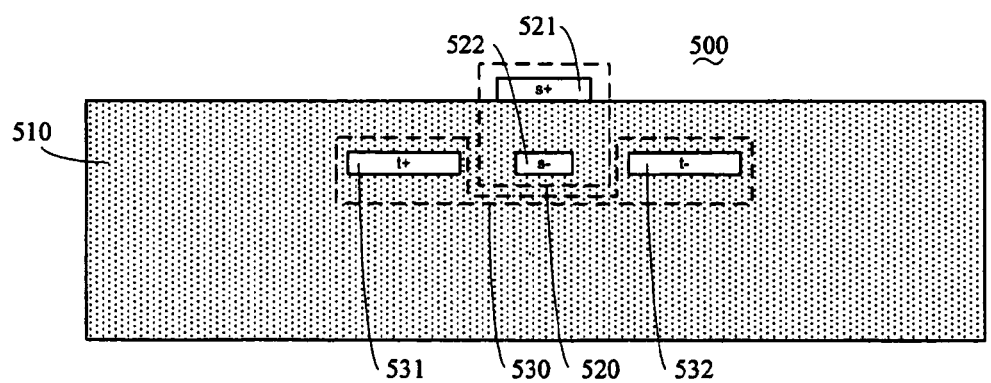
FIG. 5 illustrates an arrangement of two differential pairs in a multi-layer printed circuit board, in accordance with the fourth particular embodiment of the present invention.

Referring now to FIG. 5, wherein an arrangement of two differential pairs in a multi-layer printed circuit board 500, in accordance with the fourth particular embodiment of the present invention, is illustrated. As shown, the printed circuit board 500 comprises a dielectric material 510 with a dielectric constant $\in 4$, a first differential pair 520 and a second differential pair 530. The first differential pair 520 further comprises a first signal trace 521 and a second signal trace 522, while the second differential pair 530 further comprises a third signal trace 531 and a fourth signal trace 532. The first signal trace 521 is disposed on the dielectric material 510, while the second signal trace 522, the third signal trace 531 and the fourth signal trace 532 are disposed in the dielectric material 510. As shown, the spacing between the first signal trace 521 and the third signal trace 531 is equal to the spacing between the first signal trace 521 and the fourth signal trace 532. Besides, the spacing between the second signal trace 522 and the third signal trace 531 is equal to the spacing between the second signal trace 522 and the fourth signal trace 532. Furthermore, the second signal trace 522, the third signal trace 531 and the fourth signal trace 532 are disposed in one layer of the multi-layer printed circuit board 500, while the second signal trace 522 is substantially below the first signal trace 521. Similar to the above discussions for the first embodiment of the present invention, the crosstalk on the first signal trace 521 induced by the third signal trace 531 may be denoted X13, while the crosstalk on the first signal trace 521 induced by the fourth signal trace 531 may be denoted as X14. Since the spacing between the first signal trace 521 and the third signal trace 531 is equal to the spacing between the first signal trace 521 and the fourth signal trace 532, the resultant crosstalk on the first signal trace 521 induced by the second differential pair 530 is zero. Similarly, the resultant crosstalk on the second signal trace 522 induced by the second differential pair is also zero. Therefore, the total crosstalk on the first differential pair 520 due to the second differential pair 530 is zero.

Figure 6:
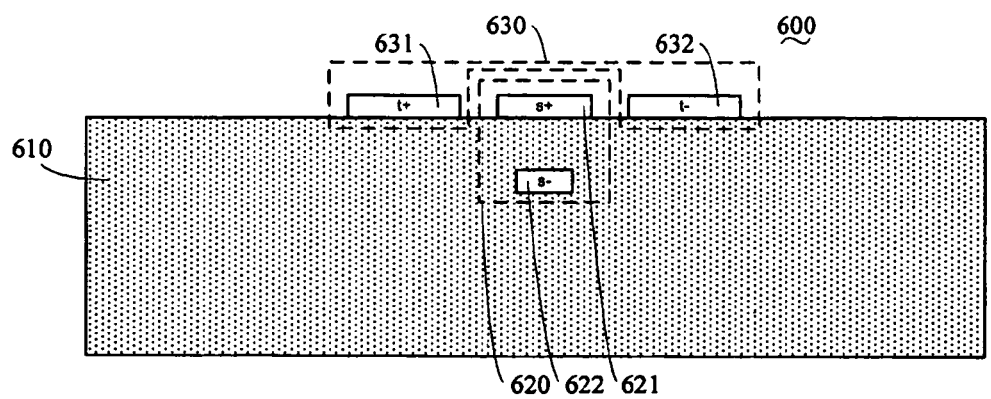
FIG. 6 illustrates an arrangement of two differential pairs in a multi-layer printed circuit board, in accordance with the fifth particular embodiment of the present invention.

Referring now to FIG. 6, wherein an arrangement of two differential pairs in a multi-layer printed circuit board 600, in accordance with the fifth particular embodiment of the present invention, is illustrated. As shown, the printed circuit board 600 comprises a dielectric material 610 with a dielectric constant $\in 5$, a first differential pair 620 and a second differential pair 630. The first differential pair 620 further comprises a first signal trace 621 and a second signal trace 622, while the second differential pair 630 further comprises a third signal trace 631 and a fourth signal trace 632. The first signal trace 621, the third signal trace 631 and the fourth signal trace 632 are disposed on the dielectric material 610, while the second signal trace 622 is disposed in the dielectric material 610. As shown, the spacing between the first signal trace 621 and the third signal trace 631 is equal to the spacing between the first signal trace 621 and the fourth signal trace 632. Besides, the spacing between the second signal trace 622 and the third signal trace 631 is equal to the spacing between the second signal trace 622 and the fourth signal trace 632. The second signal trace 622 is substantially below the first signal trace 621. Similar to the above discussions for the first embodiment of the present invention, the crosstalk on the first signal trace 621 induced by the third signal trace 631 may be denoted X13, while the crosstalk on the first signal trace 621 induced by the fourth signal trace 631 may be denoted as X14. Since the spacing between the first signal trace 621 and the third signal trace 631 is equal to the spacing between the first signal trace 621 and the fourth signal trace 632, the resultant crosstalk on the first signal trace 621 induced by the second differential pair 630 is zero. Similarly, the resultant crosstalk on the second signal trace 622 induced by the second differential pair is also zero. Therefore, the total crosstalk on the first differential pair 620 due to the second differential pair 630 is zero.

Figure 7:
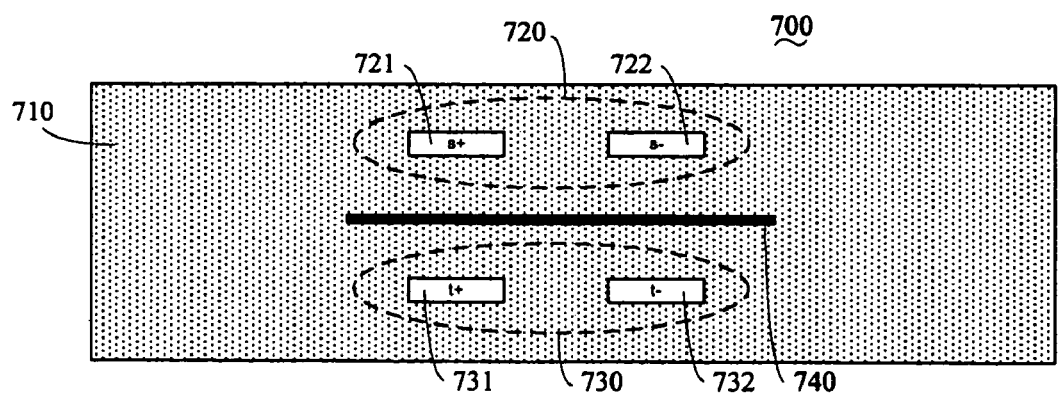
FIG. 7 illustrates an arrangement of two differential pairs in a multi-layer printed circuit board, in accordance with the sixth particular embodiment of the present invention.

Attention is now directed to FIG. 7, wherein an arrangement of differential pairs in a multi-layer printed circuit board 700, in accordance with the sixth particular embodiment of the present invention, is illustrated. The multi-layer printed circuit board 700 comprises a dielectric material 710 with a dielectric constant $\in 6$, a first differential pair 720, a second differential pair 730 and a ground plane 740. The first differential pair 720 further comprises a first signal trace 721 and a second signal trace 722, while the second differential pair 730 further comprises a third signal trace 731 and a fourth signal trace 732. The first differential pair 720, the second differential pair 730 and the ground plane 740 are disposed in the dielectric material 710. As shown in FIG. 7, the first differential pair is disposed in one layer of the multi-layer printed circuit board 700, while the second differential pair is disposed in another layer of the multi-layer printed circuit board 700. The ground plane 740 is disposed in a layer between the layer where the first differential pair 720 is disposed and the layer where the second differential pair 730 is disposed. Since crosstalk may significantly be reduced (shielded or absorbed) by the ground plane 740, the resultant crosstalk on the first differential pair 720 induced by the second differential pair 730, and vice versa, is thus negligible.

Figure 8:
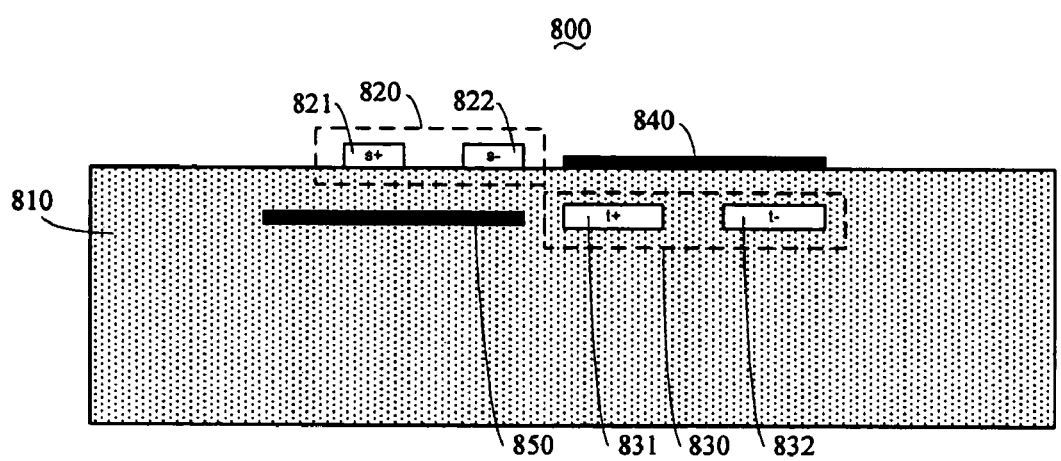
FIG. 8 illustrates an arrangement of two differential pairs in a multi-layer printed circuit board, in accordance with the seventh particular embodiment of the present invention.

Referring to FIG. 8, wherein an arrangement of differential pairs in a multi-layer printed circuit board 800, in accordance with the seventh particular embodiment of the present invention, is illustrated. The multi-layer printed circuit board 800 comprises a dielectric material 810 with a dielectric constant .epsilon.7, a first differential pair 820, a second differential pair 830, a first ground plane 840 and a second ground plane 850. The first differential pair 820 further comprises a first signal trace 821 and a second signal trace 822, while the second differential pair 830 further comprises a third signal trace 831 and a fourth signal trace 832. The first differential pair 820 and the first ground plane 840 are disposed on the dielectric material 810, while the second differential pair 830 and the second ground plane 850 are disposed in one layer of the dielectric material 810. As shown, the first ground plane 840 is substantially above the second differential pair 830, while the second ground plane 850 is substantially below the first differential pair 820. Since the spacing between the first signal trace 821 and the second differential pair 830 and the spacing between the fourth signal trace 832 and the first differential pair 820 are far enough apart, the crosstalk on the first differential pair 820 induced by the fourth signal trace 832 and the crosstalk on the second differential pair 830 induced by the first signal trace 821 are negligible. As a result, only the crosstalk on the second signal trace 822 induced by the third signal trace 831, and vice versa, is significant. However, the presence of the first ground plane 840 and the second ground plane 850 shields or absorbs most of the crosstalk between the second signal trace 822 and the third signal trace 831, leaving only a very small "aperture" for inducing crosstalk between the first differential pair 820 and the second differential pair 830, the resultant crosstalk on the first differential pair 820 induced by the second differential pair 830, and vice versa, is thus negligible.

Figure 9:
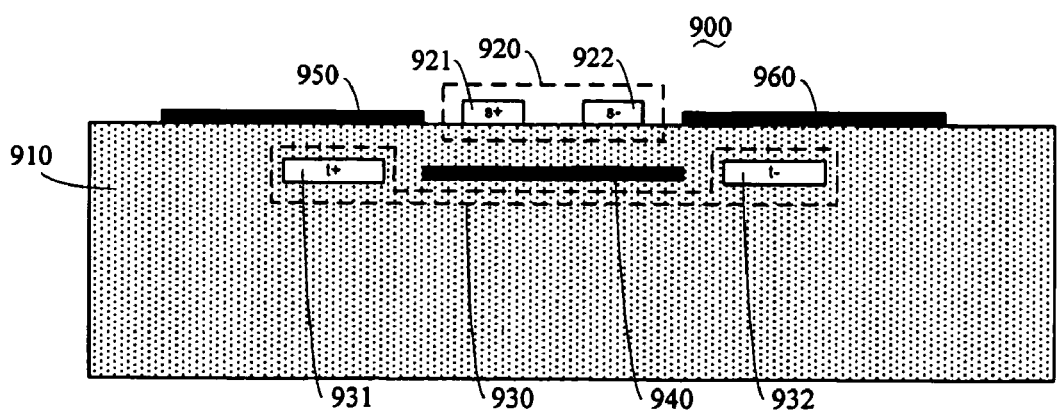
FIG. 9 illustrates an arrangement of two differential pairs in a multi-layer printed circuit board, in accordance with the eighth particular embodiment of the present invention.

Referring to FIG. 9, wherein an arrangement of differential pairs in a multi-layer printed circuit board 900, in accordance with the eighth particular embodiment of the present invention, is illustrated. The multi-layer printed circuit board 900 comprises a dielectric material 910 with a dielectric constant .epsilon.8, a first differential pair 920, a second differential pair 930, a first ground plane 940, a second ground plane 950 and a third ground plane 960. The first differential pair 920 further comprises a first signal trace 921 and a second signal trace 922, while the second differential pair 930 further comprises a third signal trace 931 and a fourth signal trace 932. The first differential pair 920, the first ground plane 940 and the second ground plane 950 are disposed on the dielectric material 910, while the second differential pair 930 and the third ground plane 950 are disposed in one layer of the dielectric material 910. As shown, the third ground plane 950 is disposed between the third signal trace 931 and the fourth signal trace 932. Also, the third signal trace 931 is substantially below the first ground plane 940, while the fourth signal trace 932 is substantially below the second ground plane 950. Since the spacing between the first signal trace 921 and the fourth signal trace 932 and the spacing between the second signal trace 922 and the third signal trace 931 are far enough apart, the crosstalk on the first signal trace 921 induced by the fourth signal trace 932 and the crosstalk on the second signal trace 922 induced by the third signal trace 931 are negligible. As a result, only the crosstalk on the first signal trace 921 induced by the third signal trace 931, and vice versa, and on the second signal trace 922 induced by the fourth signal trace 932, and vice versa, are significant. However, the presence of the first ground plane 940, the second ground plane 950 and the third ground plane 960 shields or absorbs most of the crosstalk between the first signal trace 921 and the third signal trace 931, and between the second signal trace 922 and the fourth signal trace 932, leaving only a very small "aperture" for inducing crosstalk between the first signal trace 921 and the third signal trace 931, and between the second signal trace 922 and the fourth signal trace 932, the resultant crosstalk on the first differential pair 920 induced by the second differential pair 930, and vice versa, is thus negligible.

It can be understood that in the conventional trace design of the printed circuit board each of the differential pairs is arranged in the same layer and all the differential pairs are intentionally side by side spatially arranged on the same level. This stiff format result in a huge occupying layout on the printed circuit board. Sometimes, to keep the small dimension of the printed circuit board, it is required to move some differential pairs to another layers, thus resulting in increase of the thickness of the printed circuit board. Oppositely, in the instant invention and the applicant's earlier U.S. Pat. No. 6,486,405, each pair of some differential pairs are arranged in different levels instead of the same level and intentionally intersected with another different pair, of which the two corresponding traces are either in the same level (as shown in FIGS. 3, 5 and 6) or in the different levels (as shown in FIGS. 2 and 4). This alternation results in a dense/cross arrangement of the differential pairs in comparison with the conventional co-level spreading type. Accordingly, the instant invention may reduce layout area and/or the thickness of the printed circuit board. On the other hand, in the embodiments as shown in FIGS. 7, 8 and 9, even though the two traces of each different pair are located at the same level, the grounding plane (trace) 740, 840, 850, 940, 950 and 960 are alternately arranged with the differential pairs either at the same level (as shown in FIGS. 8 and 9) or at the different level (as shown in FIG. 7). These approaches also lead to a dense arrangement of the differential pairs, thus reducing the dimension of the printed circuit board.

While the present invention is described in detail with reference to the illustrated embodiments, it is appreciated that no limitation is intended by the above descriptions. Various equivalent modifications or alterations of the preferred embodiments described above will be apparent to those having ordinary skill in the art benefited from the disclosures as set forth above, it is therefore construed that the present invention is defined in the following claims that all such equivalent modifications or alterations of the preferred embodiments given above, e.g., provision of the tiny grounding strip beside the signal trace, are considered within the spirit and scope of the present invention.

What is claimed is:

1. An arrangement of differential pairs for eliminating crosstalk in a printed circuit board having a plurality of layers, comprising:
   a dielectric material;
   a first differential pair disposed in said dielectric material, further comprising a first signal trace and a second signal trace; and
   a second differential pair disposed in said dielectric material, further comprising a third signal trace and a fourth signal trace; wherein
   said first signal trace is disposed in one of the plurality of layers, while said second signal trace is disposed in another one of the plurality of layers; and
   wherein said fourth signal trace is disposed in one of the plurality of layers where said first signal trace is disposed therein, while said third signal trace is disposed in another one of the plurality of layers where said second signal trace is disposed therein.

2. The arrangement as recited in claim 1, wherein said first differential pair and said second differential pair form a rectangular shape.

3. A printed circuit board comprising:
   a substrate defining different levels along a vertical direction thereof, said substrate integrally equipped with first and second differential pairs closely arranged with each other,
   said first different pair defining spaced first and second traces,
   said second differential pair defining spaced third and fourth traces,
   the first trace and the second trace being located at different first and second levels; wherein
   an intersection angle between a first line linking center points of the first trace and the second trace, and a second line linking center points of the third trace and the fourth trace, is neither zero nor ninety.

4. The printed circuit board as recited in claim 3, wherein the fourth trace is located at the same first level with the first trace, and the third trace is located at a same second level with the second trace.

5. The printed circuit board as recited in claim 3, wherein a cross-sectional configuration of the traces is rectangular having a long side in a horizontal direction and a short side in the vertical direction.

6. The printed circuit board as recited in claim 5, wherein a distance between the two center points of the first differential pair in the vertical direction is smaller than that in the horizontal direction.

* * * * *